(12) United States Patent
Na

(10) Patent No.: US 7,671,649 B2
(45) Date of Patent: Mar. 2, 2010

(54) APPARATUS AND METHOD FOR GENERATING MULTI-PHASE CLOCKS

(75) Inventor: Kwang-Jin Na, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 45 days.

(21) Appl. No.: 12/003,681

(22) Filed: Dec. 31, 2007

(65) Prior Publication Data

US 2009/0115486 A1   May 7, 2009

(30) Foreign Application Priority Data

Nov. 2, 2007   (KR) .................... 10-2007-0111481

(51) Int. Cl.
   *H03L 7/06* (2006.01)
(52) U.S. Cl. ..................... 327/158; 327/161
(58) Field of Classification Search ............... 327/158, 327/161
   See application file for complete search history.

(56) References Cited

U.S. PATENT DOCUMENTS

| | | | |
|---|---|---|---|
| 6,842,399 B2 * | 1/2005 | Harrison ............... | 365/189.07 |
| 6,844,761 B2 * | 1/2005 | Byun et al. ............... | 327/149 |
| 7,042,971 B1 * | 5/2006 | Flanagan et al. ........... | 375/376 |
| 7,308,372 B2 * | 12/2007 | Rifani et al. ............. | 702/69 |
| 7,336,752 B2 * | 2/2008 | Vlasenko et al. ........... | 375/376 |
| 7,391,244 B2 * | 6/2008 | Morche .................... | 327/158 |
| 7,428,284 B2 * | 9/2008 | Lin ........................ | 375/355 |

FOREIGN PATENT DOCUMENTS

| | | |
|---|---|---|
| JP | 2000-341100 | 12/2000 |
| KR | 10-2004-0009269 A | 1/2004 |
| KR | 10-2005-0048838 A | 5/2005 |
| KR | 10-2005-0115703 | 12/2005 |

OTHER PUBLICATIONS

Korean Office Action issued in Korean Patent Application No. KR 10-2007-0111481, mailed Jan. 23, 2009.
Korean Notice of Preliminary Rejection, w/ English translation thereof, issued in Korean Patent Application No. 10-2007-0111481 dated on Nov. 11, 2008.

* cited by examiner

*Primary Examiner*—Kenneth B. Wells
(74) *Attorney, Agent, or Firm*—IP & T Law Firm PLC

(57) ABSTRACT

An apparatus for generating multi-phase clocks in accordance with the present invention includes a clock delay configured to delay a source clock by a delay time corresponding to a control signal to generate a plurality of clocks; a clock multiplexer configured to output a first clock for a first locking region and a second clock for a second locking region sequentially as a selected clock in response to a locking detection signal; a phase detector configured to detect a phase of the selected clock in comparison to a phase of the source clock to output a phase detection signal; and a control voltage signal generator configured to generate the control signal corresponding to the phase detection signal.

24 Claims, 6 Drawing Sheets

APPARATUS AND METHOD FOR GENERATING MULTI-PHASE CLOCKS

CROSS-REFERENCE TO RELATED APPLICATIONS

This application claims priority of Korean patent application number 10-2007-0111481, filed on Nov. 2, 2007, which is incorporated by reference in its entirety.

BACKGROUND OF THE INVENTION

The subject matter relates to a semiconductor device, and more particularly, to an apparatus and a method for generating multi-phase clocks, which is capable of reducing phase differences between the multi-phase clocks caused by a duty error.

In a semiconductor device such as a double data rate synchronous dynamic random access memory (DDR SDRAM), its operation speed gradually increases, its chip size gradually decrease, and its operation voltage gradually decreases. Furthermore, the number of multi-phase clocks (MCLK) used in the semiconductor device are gradually increased. The multi-phase clocks are a plurality of clocks separated sequentially by a predetermined phase difference.

FIG. 1 is a block diagram of a conventional apparatus for generating multi-phase clocks.

Referring to FIG. 1, the conventional apparatus for generating multi-phase clocks includes a clock delay 110, a first control buffer 120, a second control buffer 130, a clock buffer 160, a phase detector 140, and a control voltage signal generator 150.

The clock delay 110 includes a first clock delay circuit 112, a second clock delay circuit 114, a third clock delay circuit 116 and a fourth clock delay circuit 118. Each of the clock delay circuits 112, 114, 116 and 118 delays a clock input thereto by a delay time corresponding to a control voltage signal V_CTR. In more detail, the first clock delay circuit 112 delays first clocks CLK0 and /CLK0 input thereto by a predetermined delay time to output second clocks CLK45 and /CLK45. The second clock delay circuit 114 delays the second clocks CLK45 and /CLK45 to output third clocks CLK90 and /CLK90. The third clock delay circuit 116 delays the third clocks CLK90 and /CLK90 to output fourth clocks CLK135 and /CLK135. The fourth clock delay circuit 118 delays the fourth clocks CLK135 and /CLK135 to output fifth clocks CLK180 and /CLK180.

The clock /CLK0 is an inverted signal of the clock CLK0. Hereinafter, the clock CLK0 is referred to as a "first positive clock" and the clock /CLK0 is referred to as a "first negative clock", which is applied in the cases of the second clocks CLK45 and /CLK45, the third clocks CLK90 and /CLK90, the fourth clocks CLK135 and /CLK135, and the fifth clocks CLK180 and /CLK180.

A first control buffer 120 buffers the first clocks CLK0 and /CLK0 to output a first input signal IN0 corresponding to the first positive clock CLK0. A second control buffer 130 buffers the fifth clocks CLK180 and /CLK180 to output a second input signal /IN180 corresponding to the fifth negative clock /CLK180.

The phase detector 140 detects a phase of the second input signal /IN180 in comparison to that of the first input signal IN0 to generate an up detection signal DET_UP or a down detection signal DET_DOWN according to the detection results. For example, if a rising edge of the second input signal /IN180 leads a rising edge of the first input signal IN0, the up detection signal DET_UP is generated to increase the delay time of the clock delay circuits 112, 114, 116 and 118. If the rising edge of the second input signal /IN180 lags behind the rising edge of the first input signal IN0, the down detection signal DET_DOWN is generated to decrease the delay time of the clock delay circuits 112, 114, 116 and 118.

The control voltage signal generator 150 generates a control voltage signal V_CTR having a voltage level corresponding to the up detection signal DET_UP or the down detection signal DET_DOWN. For example, the voltage level of the control voltage signal V_CTR decreases in response to the up detection signal DET_UP, but increases in response to the down detection signal DET_DOWN.

The control voltage signal V_CTR controls the delay time of the clock delay circuits 112, 114, 116 and 118. For example, as the voltage level of the control voltage signal V_CTR decreases, the clock delay circuits 112, 114, 116 and 118 increase the delay time thereof. On the contrary, as the voltage level of the control voltage signal V_CTR increases, the clock delay circuits 112, 114, 116 and 118 decrease the delay time thereof.

By repeatedly adjusting the delay time of the clock delay circuits 112, 114, 116 and 118, rising edges of the first positive clock CLK0 and the fifth negative clock /CLK180 can coincide with each other, which is called "locking."

If a duty ratio of the first clocks CLK0 and /CLK0 is 50:50, the clock delay 110 may delay the first positive clock CLK0 by 180° after the locking for securing a delay time of the fifth negative clock /CLK180.

The first to fourth clock delay cells 112, 114, 116 and 118 output second clocks CLK45 and /CLK45, third clocks CLK90 and /CLK90, fourth clocks CLK135 and /CLK135 and fifth clocks CLK180 and /CLK180 to the clock buffer 160, respectively. The clock buffer 160 including a plurality of clock buffer circuits 162 to 169 generates a plurality of multi-phase clocks MCLK45, MCLK90, MCLK135, MCLK180, MCLK225, MCLK270, MCLK315 and MCLK0 separated sequentially by a phase difference of 45°.

The first clock buffer circuit 162 receives the second clocks CLK45 and /CLK45 to generate a multi-phase clock MCLK45 having a phase difference of 45° with the first clocks CLK0 and /CLK0. The second clock buffer circuit 163 receives the second clocks /CLK45 and CLK45 to generate a multi-phase clock MCLK225 having a phase difference of 225° with the first clocks CLK0 and /CLK0. The multi-phase clock MCLK45 has a phase corresponding to that of the second positive clock CLK45, whereas the multi-phase clock MCLK225 has a phase corresponding to that of the second negative clock /CLK45.

The third and fourth clock buffer circuits 164 and 165 may receive the third clocks CLK90 and /CLK90 to generate a multi-phase clock MCLK90 having a phase difference of 90° and a multi-phase clock MCLK270 having a phase difference of 270° with the first clocks CLK0 and /CLK0. The fifth and sixth clock buffer circuits 166 and 167 may receive the fourth clocks CLK135 and /CLK135 to generate a multi-phase clock MCLK135 having a phase difference of 135° and a multi-phase clock MCLK315 having a phase difference of 315° with the first clocks CLK0 and /CLK0. The seventh and eighth clock buffer circuits 168 and 169 may receive the fifth clocks CLK180 and /CLK180 to generate a multi-phase clock MCLK180 having a phase difference of 180° and a multi-phase clock MCLK0 having a phase difference of 0° with the first clocks CLK0 and /CLK0.

Such multi-phase clocks MCLK45, MCLK90, MCLK135, MCLK180, MCLK225, MCLK270, MCLK315 and MCLK0 should be spaced sequentially at an interval of 45° to divide a cycle of the first clocks CLK0 and /CLK0 into eight equal parts. However, if the duty ratio of the first clocks CLK0 and /CLK0 is changed, the desired interval cannot be maintained. This will be described later in more detail with reference to FIG. 2.

FIG. 2 is an operation timing diagram of the conventional apparatus for generating multi-phase clocks shown in FIG. 1. For convenience, the first input signal IN0 will be regarded to be identical to the first positive clock CLK0 and the second input signal /IN180 will be regarded to be identical to the fifth negative clock /CLK180. Further, it will be assumed that a cycle of the first positive clock CLK0 is "Tcyc" and a duty ratio of the first positive clock CLK0 is changed by Δt such that a logic low portion of the first positive clock CLK0 has a width of Tcyc/2±Δt.

Referring to FIGS. 1 and 2, the fifth clocks CLK180 and /CLK180 are generated by delaying the first clocks CLK0 and /CLK0 by a basic delay time at the clock delay 110. Thereafter, the above described locking operation is performed to gradually shift the fifth clocks CLK180 and /CLK180. The locking operation is repeated until the rising edge of the fifth negative clock /CLK180 coincides with the rising edge of the first positive clock CLK0.

When the locking operation is completed, a delay time of the clock delay 110 becomes Tcyc/2±Δt. Accordingly, a delay time of each of the clock delay circuits 112, 114, 116 and 118 becomes a quarter of Tcyc/2±Δt, and therefore a phase error of Δt/4 occurs between each sequential pair of the multi-phase clocks MCLK45, MCLK90, MCLK135, MCLK180, MCLK225, MCLK270, MCLK315 and MCLK0. Such phase errors may impair credibility of the multi-phase clocks, which will become more serious as the frequency of the clocks increases.

SUMMARY OF THE INVENTION

Embodiments of the present invention are directed to providing an apparatus for generating multi-phase clocks that can secure a desired delay time to generate accurate multi-phase clocks even if a duty ratio of the clocks is changed.

Embodiments of the present invention are also directed to providing a method for generating multi-phase clocks that can secure a desired delay time to generate accurate multi-phase clocks even if a duty ratio of the clocks is changed.

In accordance with an aspect of the present invention, there is provided an apparatus for generating multi-phase clocks including a clock delay configured to delay a source clock by a delay time corresponding to a control signal to generate a plurality of clocks; a clock multiplexer configured to output a first clock for a first locking region and a second clock for a second locking region sequentially as a selected clock in response to a locking detection signal; a phase detector configured to detect a phase of the selected clock in comparison to that of the source clock to output a phase detection signal; and a control voltage signal generator configured to generate the control signal corresponding to the phase detection signal.

In the method for generating multi-phase clocks using a delay time for locking a source clock and a delayed clock of the source clock, a first locking region performs a first locking operation using a first clock and a second locking region performs a second locking operation using a second clock. A plurality of multi-phase clocks separated sequentially by an exact phase difference can be generated using the delay time corresponding to one cycle of the source clock obtained by the above described method.

DESCRIPTION OF SPECIFIC EMBODIMENTS

Hereinafter, an apparatus and a method for generating multi-phase clocks in accordance with the present invention will be described in detail with reference to the accompanying drawings.

Figure 1:
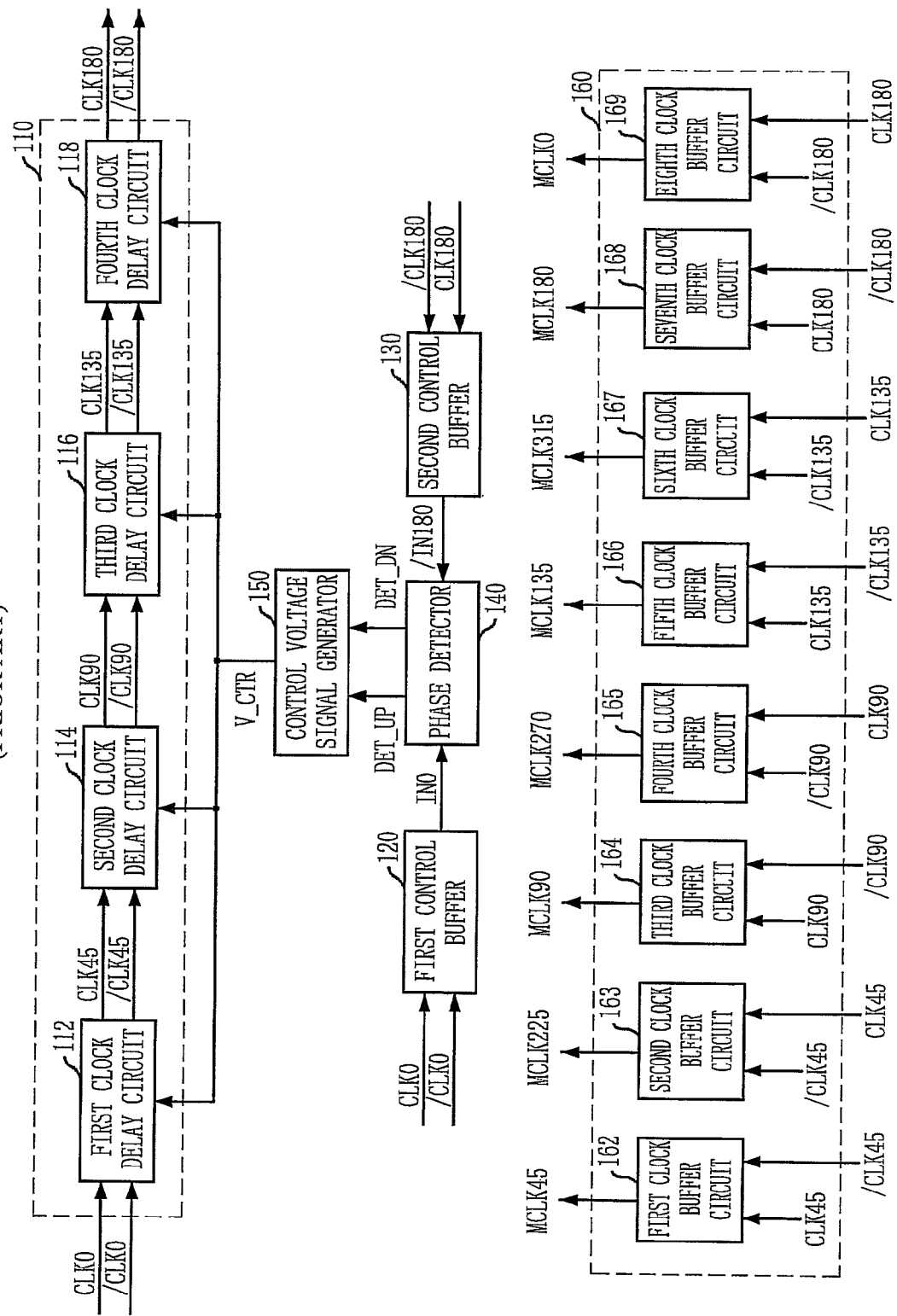
FIG. 1 is a block diagram of a conventional apparatus for generating multi-phase clocks.
Figure 2:
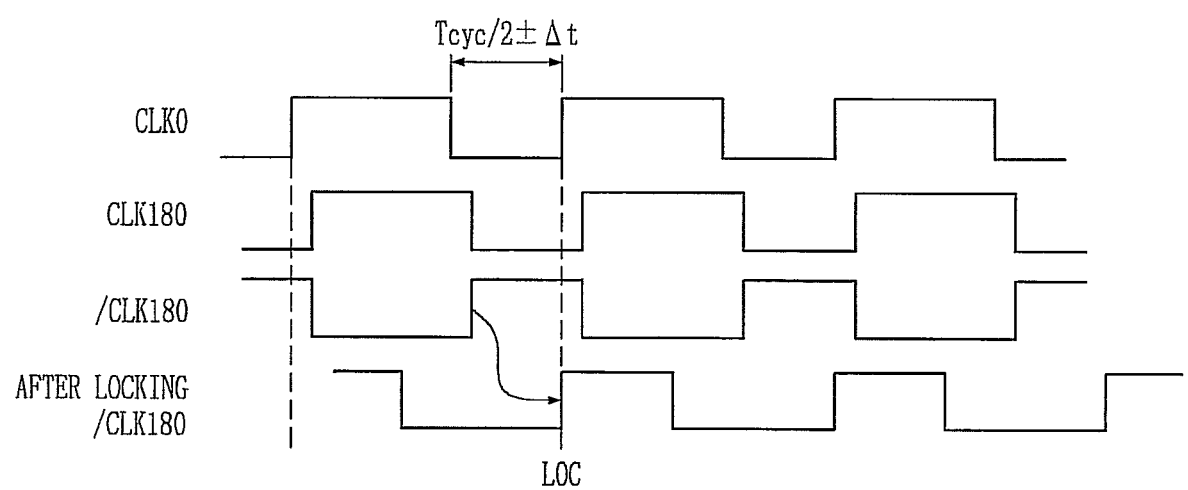
FIG. 2 is an operation timing diagram of the conventional apparatus for generating multi-phase clocks shown in FIG. 1.
Figure 3:
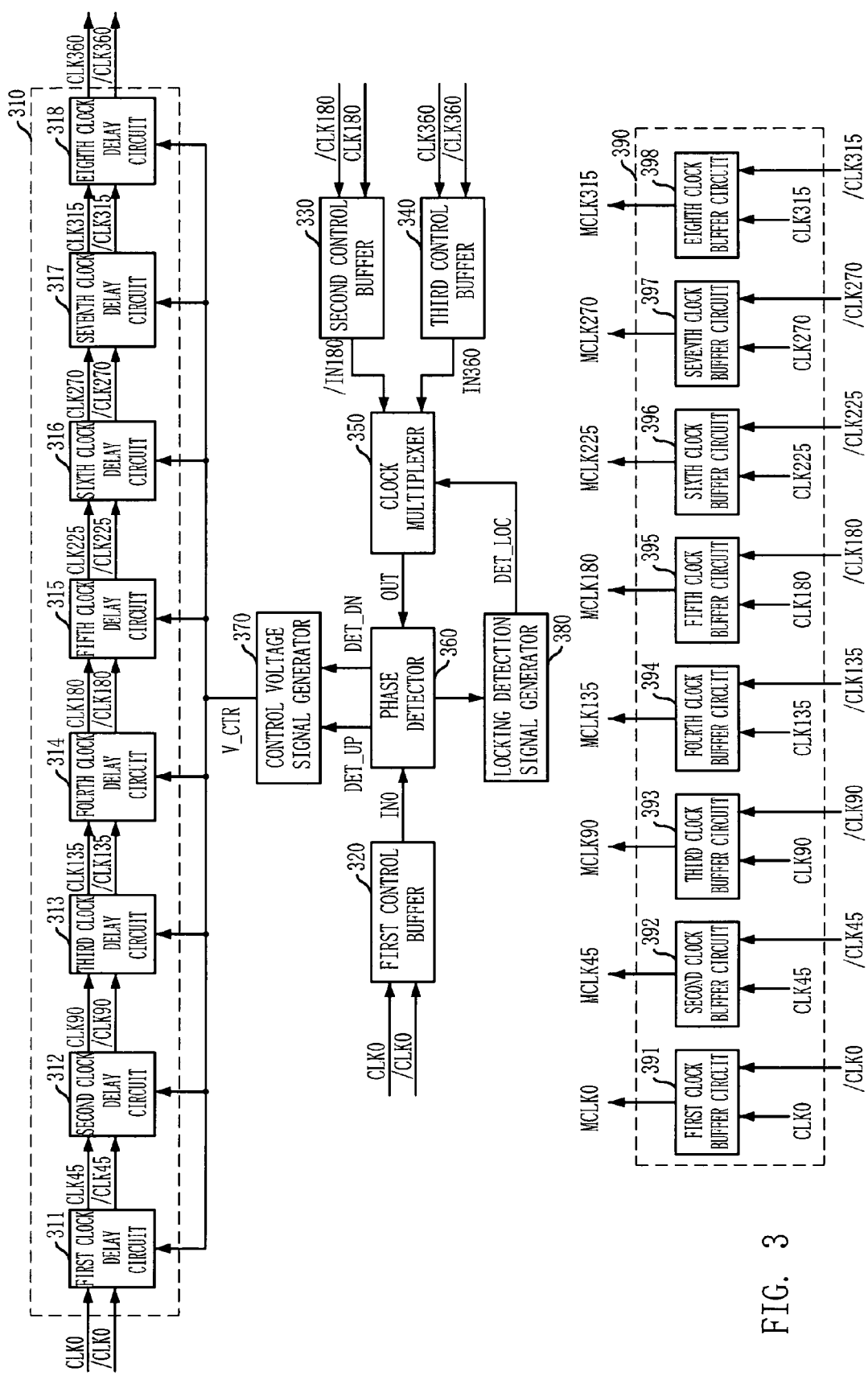
FIG. 3 is a block diagram of an apparatus for generating multi-phase clocks in accordance with an embodiment of the present invention.

FIG. 3 is a block diagram of an apparatus for generating multi-phase clocks in accordance with an embodiment of the present invention.

Referring to FIG. 3, the apparatus for generating multi-phase clocks includes a clock delay 310, control buffers 320, 330 and 340, a phase detector 360, a control voltage signal generator 370, a locking detection signal generator 380 and a clock buffer 390.

The clock delay 310 includes a first clock delay circuit 311, a second clock delay circuit 312, a third clock delay circuit 313, a fourth clock delay circuit 314, a fifth clock delay circuit 315, a sixth clock delay circuit 316, a seventh clock delay circuit 317, and an eighth clock delay circuit 318. Each of the plurality of clock delay circuits 311 to 318 delays an input clock by a delay time corresponding to a control voltage signal V_CTR.

The first clock delay circuit 311 delays first clocks CLK0 and /CLK0, which are inputted into the clock delay 310, by a delay time corresponding to the control voltage signal V_CTR to output second clocks CLK45 and /CLK45. The second clock delay circuit 312 delays the second clocks CLK45 and /CLK45 by the delay time corresponding to the control voltage signal V_CTR to output third clocks CLK90 and /CLK90. The third clock delay circuit 313 delays the third clocks CLK90 and /CLK90 by the delay time corresponding to the control voltage signal V_CTR to output fourth clocks CLK135 and /CLK135. The fourth clock delay circuit 314 delays the fourth clocks CLK135 and /CLK135 by the delay time corresponding to the control voltage signal V_CTR to output fifth clocks CLK180 and /CLK180. The fifth clock delay circuit 315 delays the fifth clocks CLK180 and /CLK180 by the delay time corresponding to the control voltage signal V_CTR to output sixth clocks CLK225 and /CLK225. The sixth clock delay circuit 316 delays the sixth clocks CLK225 and /CLK225 by the delay time corresponding to the control voltage signal V_CTR to output seventh clocks CLK270 and /CLK270. The seventh clock delay circuit 317 delays the seventh clocks CLK270 and /CLK270 by the delay time corresponding to the control voltage signal V_CTR to output eighth clocks CLK315 and /CLK315. The eighth clock delay circuit 318 delays the eighth clocks CLK315 and /CLK315 by the delay time corresponding to the control voltage signal V_CTR to output ninth clocks CLK360 and /CLK360.

The first clock /CLK0 is a negative signal of the first clock CLK0. Hereinafter, the first clock CLK0 is referred to as a "first positive clock," and the first clock /CLK0 is referred to as a "first negative clock", which is the same in the cases of the second clocks CLK45 and /CLK45, the third clocks CLK90 and /CLK90, the fourth clocks CLK135 and /CLK135, the fifth clocks CLK180 and /CLK180, the sixth clocks CLK255 and /CLK255, the seventh clocks CLK270 and /CLK270, the eighth clocks CLK315 and /CLK315, and the ninth clocks CLK360 and /CLK360.

The control buffers include a first control buffer 320, a second control buffer 330 and a third control buffer 340. The first control buffer 320 buffers the first clocks CLK0 and /CLK0 to output a first input signal IN0 corresponding to the first positive clock CLK0. The second control buffer 330 buffers the fifth clocks CLK180 and /CLK180 to output a second input signal /IN180 corresponding to the fifth negative clock /CLK180. The third control buffer 340 buffers the ninth clocks CLK360 and /CLK360 to output a third input signal IN360 corresponding to the ninth positive clock CLK360.

The apparatus for generating multi-phase clocks in accordance with the embodiment of the present invention performs a locking operation twice to secure a delay time corresponding to one cycle of the first positive clock CLK0. Hereinafter, the region for locking the fifth negative clock /CLK180 to the first positive clock CLK0 is referred to as a "first locking region," and the region for locking the ninth positive clock CLK360 to the first positive clock CLK0 is referred to as a "second locking region."

The clock multiplexer 350 sequentially outputs a second input signal /IN180 and a third input signal IN360 in response to a locking detection signal DET_LOC. The second input signal /IN180 corresponds to the fifth negative clock /CLK180 and is locked to the first input signal IN0 in the first locking region. The third input signal IN360 corresponds to the ninth positive clock CLK360 and is locked to the first input signal IN0 in the second locking region.

Figure 4:
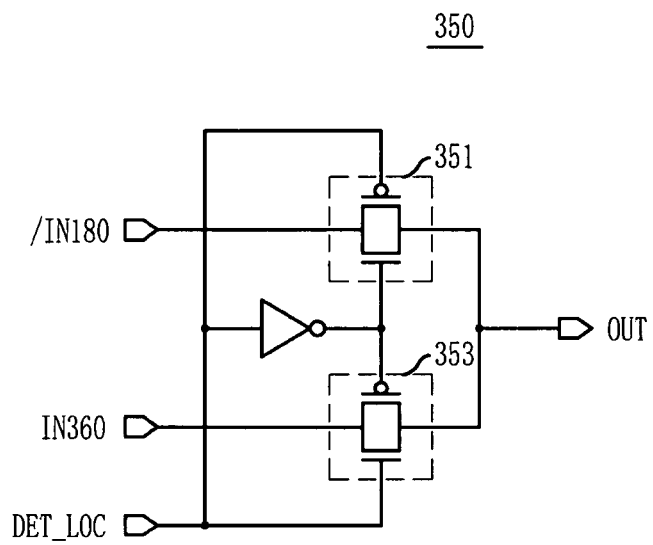
FIG. 4 is a circuit diagram of a clock multiplexer in FIG. 3.

FIG. 4 is a circuit diagram of a clock multiplexer in FIG. 3.

Referring to FIG. 4, the clock multiplexer 350 may include a first transfer circuit 351 and a second transfer circuit 353. The first transfer circuit 351 transfers the second input signal /IN180 in response to the locking detection signal DET_LOC. The second transfer circuit 353 transfers the third input signal IN360 in response to the locking detection signal DET_LOC. For example, when the locking detection signal DET_LOC has a logic low level, the clock multiplexer 350 outputs the second input signal /IN180 as an output signal OUT and when the locking detection signal DET_LOC has a logic high level, the clock multiplexer 350 outputs the third input signal IN360 as an output signal OUT.

Referring again to FIG. 3, the phase detector 360 detects a phase of the output signal OUT of the clock multiplexer 350 in comparison to that of the first input signal IN0 to output an up detection signal DET_UP or a down detection signal DET_DN that are selected based on the detection results. For example, if a rising edge of the output signal OUT of the clock multiplexer 350 leads a rising edge of the first input signal IN0, the up detection signal DET_UP is activated for increasing a delay time of the clock delay 110. On the contrary, if the rising edge of the output signal OUT of the clock multiplexer 350 lags behind the rising edge of the first input signal IN0, the down detection signal DET_DN is activated for decreasing the delay time of the clock delay 110.

The control voltage signal generator 370 generates a control voltage signal V_CTR having a voltage level corresponding to the up detection signal DET_UP and the down detection signal DET_DN. For example, the voltage level of the control voltage signal V_CTR decreases in response to the up detection signal DET_UP and increases in response to the down detection signal DET_DN. Since the phase detector 360 and the control voltage signal generator 370 are well known in the art, detailed description thereof will be omitted.

The control voltage signal V_CTR controls the delay time of the clock delay circuits 311 to 318. For example, as the voltage level of the control voltage signal V_CTR decreases, the clock delay circuits 311 to 318 operate more slowly to increase the delay time thereof. On the contrary, as the voltage level of the control voltage signal V_CTR increases, the clock delay circuits 311 to 318 operate faster to decrease the delay time thereof.

Figure 5:
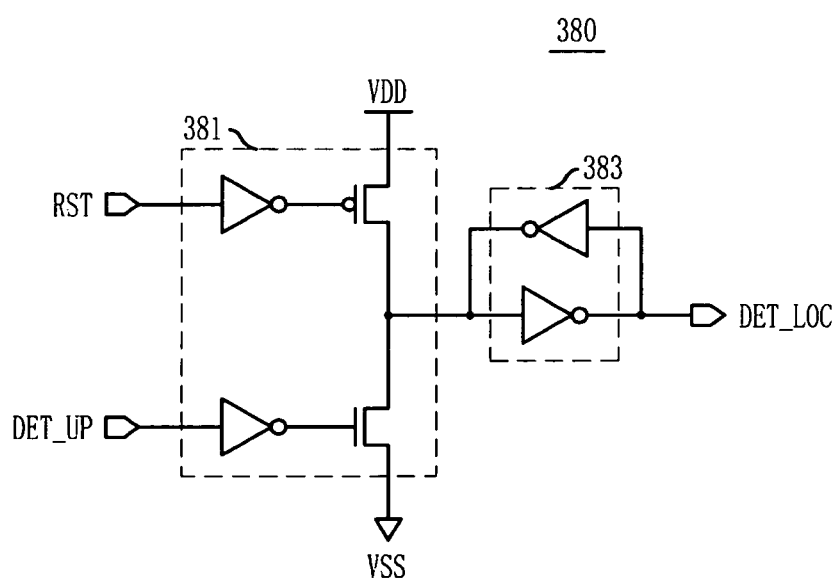
FIG. 5 is a circuit diagram of a locking detection signal generator in FIG. 3.

The apparatus for generating multi-phase clocks in accordance with the embodiment of the present invention may further include a locking detection signal generator 380. The locking detection signal generator 380 generates a locking detection signal DET_LOC according to a locking result of the fifth negative clock /CLK180 and the first positive clock CLK0. FIG. 5 is a circuit diagram of the locking detection signal generator shown in FIG. 3.

Referring to FIG. 5, the locking detection signal generator 380 is reset in response to the reset signal RST. The locking detection signal generator 380 may include a locking detection circuit 381 and a latch circuit 383. The locking detection circuit 381 detects the up detection signal DET_UP. The latch circuit 383 latches an output signal of the locking detection circuit 381 to output the locking detection signal DET_LOC.

First of all, in the first locking region, because the fifth negative clock /CLK180 leads the first positive clock CLK0, the up detection signal DET_UP has a logic high level. Accordingly, the locking detection circuit 381 outputs a signal of a logic high level in response to the up detection signal DET_UP and the reset signal RST, and then the latch circuit 383 outputs the locking detection signal of a logic low level. Thereafter, if the fifth negative clock /CLK180 lags behind the first positive clock CLK0, the up detection signal DET_UP has a logic low level, so that the locking detection signal DET_LOC of a logic high level is outputted from the locking detection signal generator 380.

The locking detection signal DET_LOC may have information about the locking of the fifth negative clock /CLK180 to the first positive clock CLK0. The up detection signal DET_UP may be used in the above described embodiment. However, the down detection signal DET_DN may also be used.

Referring again to FIG. 4, the clock multiplexer 350 outputs the second input signal /IN180 in response to the locking detection signal DET_LOC in the first locking region. After the fifth negative clock /CLK180 is locked to the first positive clock CLK0, the clock multiplexer 180 outputs the third input signal IN360.

The apparatus for generating multi-phase clocks in accordance with the embodiment of the present invention can secure a delay time for delaying a first positive clock CLK0 by exactly 360° to output a ninth positive clock CLK360 through a first locking operation and a second locking operation. This will be described later with reference to FIG. 6 in detail.

Referring again to FIG. 3, the first clocks CLK0 and /CLK0 and the second to eighth clocks CLK45, /CLK45, CLK90, /CLK90, CLK135, /CLK135, CLK180, /CLK180, CLK225, /CLK225, CLK270, /CLK270, CLK315 and /CLK315 outputted from the first to seventh delay circuits 311 to 317 are inputted into the clock buffer 390. Then, the clock buffer 390 generates a plurality of multi-phase clocks MCLK0, MCLK45, MCLK90, MCLK135, MCLK180, MCLK225, MCLK270 and MCLK315 separated sequentially by a phase difference of exactly 45°.

In more detail, the clock buffer 390 includes first to eighth clock buffer circuits 391 to 398. The first clock buffer circuit 391 buffers the first clocks CLK0 and /CLK0 to generate a multi-phase clock MCLK0 corresponding to the first positive clock CLK0. The second buffer circuit 392 buffers the second clocks CLK45 and /CLK45 to generate a multi-phase clock MCLK45 having a phase difference of 45° with the first positive clock CLK0. The third buffer circuit 393 buffers the third clocks CLK90 and /CLK90 to generate a multi-phase clock MCLK90 having a phase difference of 90° with the first positive clock CLK0. The fourth buffer circuit 394 buffers the fourth clocks CLK135 and /CLK135 to generate a multi-phase clock MCLK135 having a phase difference of 135° with the first positive clock CLK0. The fifth buffer circuit 395 buffers the fifth clocks CLK180 and /CLK180 to generate a multi-phase clock MCLK180 having a phase difference of 180° with the first positive clock CLK0. The sixth buffer circuit 396 buffers the sixth clocks CLK225 and /CLK225 to generate a multi-phase clock MCLK225 having a phase difference of 225° with the first positive clock CLK0. The seventh buffer circuit 397 buffers the seventh clocks CLK270 and /CLK270 to generate a multi-phase clock MCLK270 having a phase difference of 270° with the first positive clock CLK0. The eighth buffer circuit 398 buffers the eighth clocks CLK315 and /CLK315 to generate a multi-phase clock MCLK315 having a phase difference of 315° with the first positive clock CLK0.

According to the embodiment of the present invention, because the clock delay 310 including a plurality of clock delay circuits 311 to 318 secures a delay time corresponding to exactly one cycle of the first clocks CLK0 and /CLK0, the plurality of multi-phase clocks MCLK0, MCLK45, MCLK 90, MCLK135, MCLK 180, MCLK225, MCLK270 and MCLK315 generated at the clock buffer 390 are spaced at intervals of 45° to divide the cycle of the first clocks into eight equal parts. In addition, these intervals can be secured even though a duty ratio of the first clocks is changed.

Figure 6:
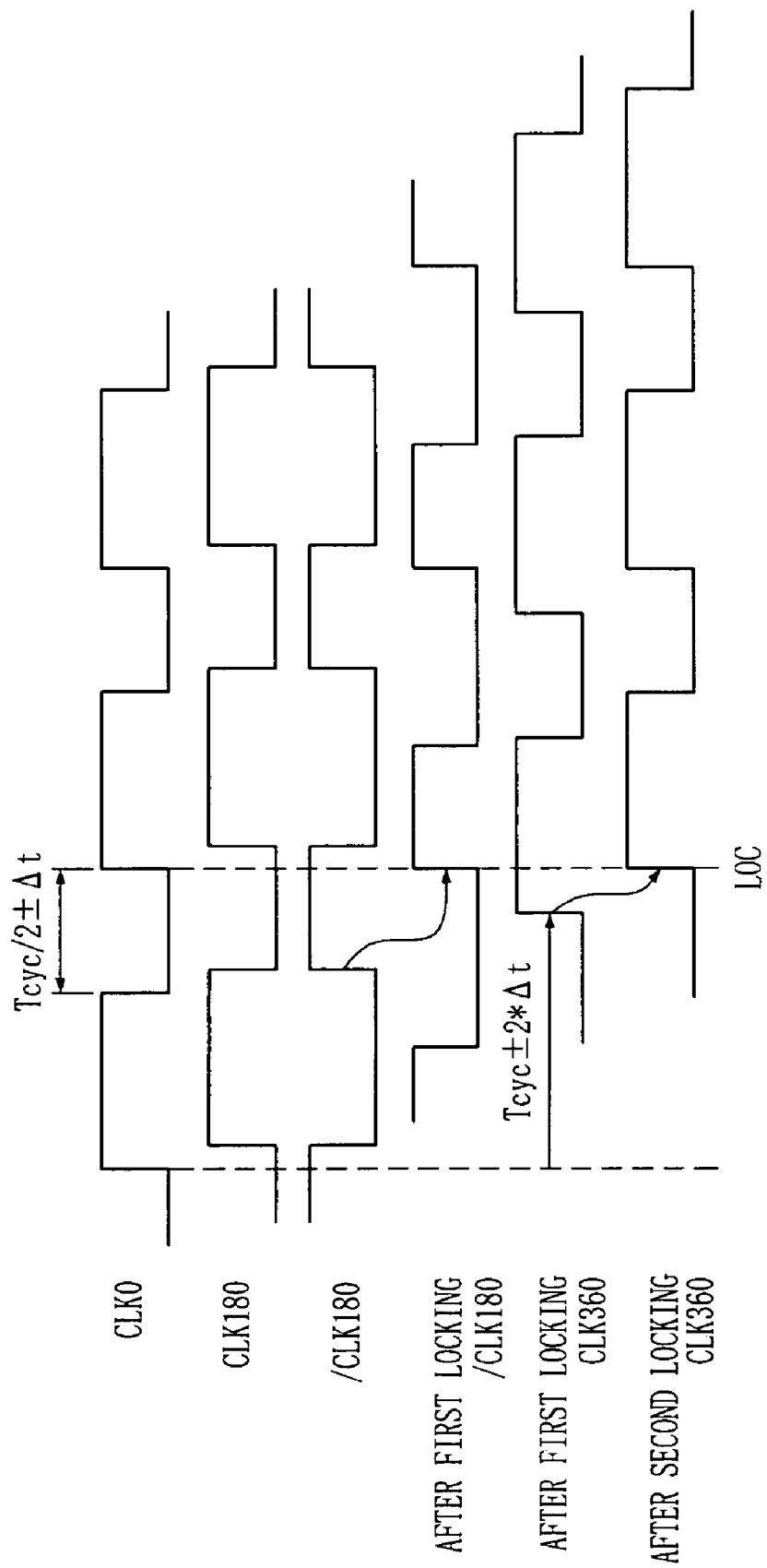
FIG. 6 is an operation timing diagram of the apparatus for generating multi-phase clocks shown in FIG. 3.

FIG. 6 is an operation timing diagram of the apparatus for generating multi-phase clocks shown in FIG. 3. For convenience, the first input signal IN0 will be regarded to be identical to the first positive clock CLK0, the second input signal /IN180 will be regarded to be identical to the fifth negative clock /CLK180, and the third input signal will be regarded to be identical to the ninth positive clock CLK360. Furthermore, it will be assumed that a cycle of the first positive clock CLK0 is "Tcyc," and a duty ratio of the first positive clock CLK0 is changed by Δt such that a logic low portion of the first positive clock CLK0 has a width of Tcyc/2±Δt.

Referring to FIGS. 3 and 6, the fifth clocks CLK180 and /CLK180 are generated by delaying the first clocks CLK0 and /CLK0 by a basic delay time at the clock delay 110. In a first locking region, a rising edge of the fifth negative clock /CLK180 is detected in comparison to a rising edge of the first positive clock CLK0 to perform a first locking operation. The first locking operation shifts the fifth negative clock /CLK180 to a locking position LOC. Resultantly, the first clocks CLK0 and /CLK0 are delayed by a delay time Tcyc/2±Δt after passing through the first to fourth clock delay circuits 311 to 314. Since the fifth to eighth clock delay circuits 315 to 318 are also controlled at the same time by the control voltage signal V_CTR, the first clocks CLK0 and /CLK0 are further delayed by a delay time Tcyc/2±Δt after passing through the fifth to eighth delay circuits 315 to 318. Therefore, the ninth positive clock CLK360 is delayed by a delay time Tcyc±2×Δt as compared to the first positive clock CLK0 after the first locking operation.

Afterwards, the locking detection signal generator 380 generates a locking detection signal DET_LOC according to information about the first locking operation. The clock multiplexer 350 outputs the ninth positive clock CLK360 in response to the locking detection signal DET_LOC. Then, a rising edge of the ninth positive clock CLK360 is detected in comparison to a rising edge of the first positive clock CLK0 to perform a second locking operation. The second locking operation shifts the ninth positive clock CLK360 to a locking position LOC. Resultantly, a delay time corresponding to the cycle of the first clocks CLK0 and /CLK0 can be secured by the clock delay 310 including the first to eighth clock delay circuits 311 to 318 regardless of the duty ratio of the first clocks CLK0 and /CLK0.

Therefore, a delay time of each of the first to eighth clock delay circuits 311 to 318 is one eighth of one cycle of the first clocks CLK0 and /CLK0, and a plurality of multi-phase clocks MCLK45, MCLK90, MCLK135, MCLK180, MCLK225, MCLK270, MCLK315 and MCLK0 are separated sequentially by a delay time corresponding to a 45° phase difference. Accordingly, it is possible to generate a plurality of multi-phase clocks MCLK45, MCLK90, MCLK135, MCLK180, MCLK225, MCLK270, MCLK315 and MCLK0 separated sequentially by a desired phase difference.

As described above, the apparatus for generating multi-phase clocks in accordance with the embodiment of the present invention can secure a delay time corresponding to one cycle of first clocks CLK0 and /CLK0 through a first locking operation and a second locking operation, even though a duty ratio of the first clocks CLK0 and /CLK0 is changed. Furthermore, the apparatus for generating multi-phase clocks can generate a plurality of multi-phase clocks MCLK45, MCLK90, MCLK135, MCLK180, MCLK225, MCLK270, MCLK315 and MCLK0 separated sequentially by a desired phase difference.

Figure 7:
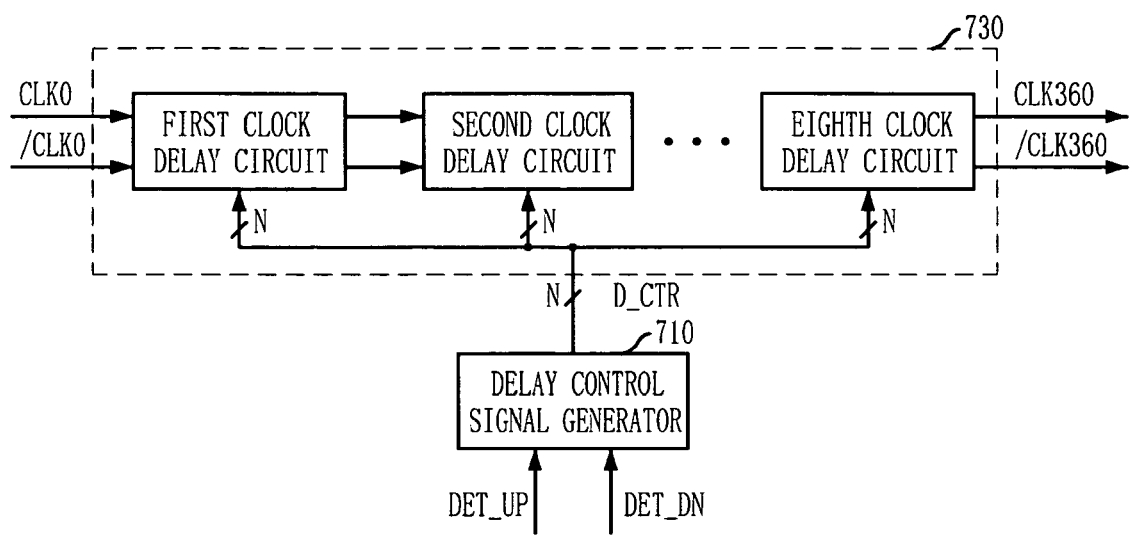
FIG. 7 is a block diagram of an apparatus for generating multi-phase clocks in accordance with another embodiment of the present invention.

FIG. 7 is a block diagram of an apparatus for generating multi-phase clocks in accordance with another embodiment of the present invention.

Referring to FIG. 7, the apparatus for generating multi-phase clocks in accordance with this further embodiment of the present invention includes a delay control signal generator 710 instead of the control voltage signal generator 370 in FIG. 3 and a clock delay 730 having a plurality of clock delay circuits.

The delay control signal generator 710 may generate a delay control signal D_CTR having N multi-bits (N is a natural number) in response to output signals DET_UP and DET_DN of the phase detector.

Each of the plurality of clock delay circuits of the clock delay 730 may include a plurality of clock delay units to delay an input clock by a delay time corresponding to the N-bit delay control signal D_CTR for shifting the input clock according to the detection signals DET_UP and DET_DN.

Locking operation is similar to that described above with reference to FIG. 6. Hereinafter, locking operation will be described assuming that the delay control signal D_CTR is a 4-bit signal and each of the plurality of clock delay circuits has four clock delay units, for example.

Each of the plurality of clock delay circuits delays the input clock by a delay time corresponding to that of one clock delay unit in response to a delay control signal D_CTR of '0001,' by a delay time corresponding to that of two clock delay units in response to a delay control signal D_CTR of '0011,' by a delay time corresponding to that of three clock delay units in response to a delay control signal D_CTR of '0111,' and by a delay time corresponding to that of four clock delay units in response to a delay control signal D_CTR of '1111.'

The apparatus for generating multi-phase clocks in accordance with this further embodiment of the present invention can secure a delay time corresponding to one cycle of first clocks CLK0 and /CLK0 even though a duty ratio of the first clocks CLK0 and /CLK0 is changed, through a first locking operation and a second locking operation, as described above with reference to FIGS. 3 to 6. Therefore, the apparatus can also generate a plurality of multi-phase clocks MCLK45, MCLK90, MCLK135, MCLK180, MCLK225, MCLK270, MCLK315 and MCLK0 separated sequentially by a desired phase difference.

As described above, an apparatus for generating multi-phase clocks in accordance with embodiments of the present invention can secure a delay time corresponding to exactly one cycle of the clocks to generate multi-phase clocks separated sequentially by an exact phase difference.

And therefore, the apparatus for generating multi-phase clocks in accordance with the embodiments of the present invention can enhance the reliability of the multi-phase clocks and semiconductor devices using the multi-phase clocks.

Although an apparatus for generating multi-phase clocks has been described for example in the above-described embodiments, the apparatus may also be used to secure a delay time corresponding to one cycle of a source clock regardless of a duty ratio of the source clock.

While the present invention has been described with respect to the specific embodiments, it will be apparent to those skilled in the art that various changes and modifications may be made without departing from the spirit and scope of the invention as defined in the following claims.

What is claimed is:

1. An apparatus for generating multi-phase clocks, comprising:
   a clock delay, with a plurality of delay circuits, configured to delay a source clock by a delay time corresponding to a control signal to generate multi-phase clocks;
   a clock multiplexer configured to selectively output a first clock and a second clock as a selected clock in response to a locking detection signal;
   a phase detector configured to detect a phase of the selected clock in comparison to a phase of the source clock to output a phase detection signal; and
   a control signal generator configured to generate the control signal corresponding to the phase detection signal,
   wherein the plurality of delay circuits are connected in series, the first clock is outputted from the delay circuit located at a middle of the series and the second clock is outputted from the delay circuit located at an end of the series.

2. The apparatus as recited in claim 1, further comprising a locking detection signal generator configured to generate the locking detection signal in response to the phase detection signal.

3. The apparatus as recited in claim 2, wherein the clock multiplexer comprises:
   a first transfer circuit configured to transfer the first clock as the selected clock in response to the locking detection signal; and
   a second transfer circuit configured to transfer the second clock as the selected clock in response to the locking detection signal.

4. The apparatus as recited in claim 1, further comprising a clock buffer configured to buffer the plurality of clocks to generate a plurality of multi-phase clocks.

5. The apparatus as recited in claim 1, wherein the control signal is adjusted so that the second clock has a phase difference of 360° with the source clock.

6. The apparatus as recited in claim 1, wherein the first clock comprises a first positive clock and a first negative clock, and the second clock comprises a second positive clock and a second negative clock.

7. The apparatus as recited in claim 6, further comprising a control buffer configured to buffer the first positive clock and the first negative clock to generate an output signal corresponding to the first negative clock.

8. The apparatus as recited in claim 6, further comprising a control buffer configured to buffer the second positive clock and the second negative clock to generate an output signal corresponding to the second positive clock.

9. The apparatus as recited in claim 6, wherein the clock multiplexer outputs the first negative clock as the first clock, and the second positive clock as the second clock.

10. The apparatus as recited in claim 2, wherein the locking detection signal generator comprises:
    a locking detection circuit configured to detect information about a locking of the first clock and the source clock; and
    a latch circuit configured to latch an output signal of the locking detection circuit to output it as the locking detection signal.

11. The apparatus as recited in claim 1, wherein the control signal has a voltage level corresponding to the phase detection signal.

12. The apparatus as recited in claim 1, wherein the clock delay comprises a plurality of clock delay circuits, and the number of the plurality of clock delay circuits correspond to the number of the plurality of clocks.

13. The apparatus as recited in claim 12, wherein the control signal comprises a multi-bit delay control signal corresponding to the phase detection signal.

14. The apparatus as recited in claim 13, wherein each of the plurality of clock delay circuits comprises a plurality of clock delay units, and the number of the plurality of clock delay units corresponds to the number of bits of the multi-bit delay control signal.

15. The apparatus as recited in claim 1, wherein the first clock is outputted during the initial operation.

16. A method for generating multi-phase clocks, the method comprising:
    generating a plurality of clocks by delaying a source clock sequentially by a delay time corresponding to a control signal;
    detecting a first phase difference between a first clock among the plurality clocks, which has half of the largest delay amount among the corresponding delay amounts of the plurality of clocks, and the source clock;
    adjusting the control signal in response to the first phase difference to lock the first clock with the source clock;
    detecting a second phase difference between a second clock among the plurality of clocks, which has the largest delay amount among the corresponding delay amounts of the plurality of clocks, and the source clock; and
    adjusting the control signal in response to the second phase difference to lock the second clock with the second source clock.

17. The method as recited in claim 16, further comprising generating a locking detection signal according to the first phase difference.

18. The method as recited in claim 16, further comprising buffering the plurality of clocks to generate a plurality of multi-phase clocks.

19. The method as recited in claim 16, wherein the first clock comprises a first positive clock and a first negative clock, and the second clock comprises a second positive clock and a second negative clock.

20. The method as recited in claim 19, further comprising buffering the first positive clock and the first negative clock to generate an output signal corresponding to the first negative clock.

21. The method as recited in claim 19, further comprising buffering the second positive clock and the second negative clock to generate an output signal corresponding to the second positive clock.

22. The method as recited in claim 17, wherein the generating of the locking detection signal comprises:
   detecting information about a locking of the first clock and the source clock; and
   latching the locking information detection result to output it as the locking detection signal.

23. The method as recited in claim 16, wherein the control signal comprises a multi-bit delay control signal.

24. An apparatus for generating multi-phase clocks, comprising:
   a clock delay configured with 2N number of delay circuits delaying a source clock by a delay time corresponding to a control signal to generate multi-phase clocks, wherein N is a positive integer;
   a clock multiplexer configured to selectively output a first clock and a second clock as a selected clock in response to a locking detection signal;
   a phase detector configured to detect a phase of the selected clock in comparison to a phase of the source clock to output a phase detection signal; and
   a control signal generator configured to generate the control signal corresponding to the phase detection signal,
   wherein the delay circuits are connected in series, the first clock is outputted from the Nth delay circuit and the second clock is outputted from the 2Nth delay circuit.

* * * * *